United States Patent
Choi

(10) Patent No.: US 7,038,495 B2
(45) Date of Patent: *May 2, 2006

(54) LOW JITTER HIGH SPEED CMOS TO CML CLOCK CONVERTER

(75) Inventor: Ka Lun Choi, Laguna Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/867,650

(22) Filed: Jun. 16, 2004

(65) Prior Publication Data

US 2004/0222822 A1    Nov. 11, 2004

Related U.S. Application Data

(63) Continuation of application No. 09/953,279, filed on Sep. 17, 2001, now Pat. No. 6,794,907.

(60) Provisional application No. 60/233,181, filed on Sep. 15, 2000.

(51) Int. Cl.
*H03K 19/086* (2006.01)

(52) U.S. Cl. .................. 326/127; 326/126; 326/63; 326/68

(58) Field of Classification Search .............. 326/63, 326/68, 115, 126–127; 327/52, 65, 63, 71
See application file for complete search history.

(56) References Cited

U.S. PATENT DOCUMENTS 4,587,477 A    5/1986    Hornak et al.

(Continued)

FOREIGN PATENT DOCUMENTS

| EP | 0 436 823 A1 | 11/1990 |
| EP | 08036616 | 2/1996 |
| JP | 2000-196681 A1 | 7/2000 |

OTHER PUBLICATIONS

Copy of the Notification of Transmittal of International Preliminary Examination Report from PCT Application No. PCT/US01/29028, filed Sep. 18, 2001, 4 pages, (mailed Jul. 20, 2004).

(Continued)

*Primary Examiner*—Anh Q. Tran
(74) *Attorney, Agent, or Firm*—Sterne, Kessler, Goldstein & Fox, P.L.L.C.

(57) ABSTRACT

Provided is a circuit to convert input CMOS level signals having a predetermined duty cycle to CML level signals having a higher duty cycle. The circuit includes two differential transistor pairs connected together. The two differential pairs are constructed and arranged to use gates of the associated transistors as inputs to receive and combine a number of phase shifted CMOS input signals. The combined CMOS input signal are converted to CML level signals which are provided as circuit outputs.

8 Claims, 3 Drawing Sheets

U.S. PATENT DOCUMENTS

| | | |
|---|---|---|
| 4,599,572 A | 7/1986 | Nakayama |
| 5,132,572 A | 7/1992 | Woo |
| 5,550,491 A | 8/1996 | Furuta |
| 5,581,210 A | 12/1996 | Kimura |
| 5,614,841 A | 3/1997 | Marbot et al. |
| 5,703,519 A | 12/1997 | Crook et al. |
| 5,742,183 A | 4/1998 | Kuroda |
| 5,838,166 A | 11/1998 | Nakamura |
| 5,889,425 A | 3/1999 | Kimura |
| 5,986,479 A | 11/1999 | Mohan |
| 6,794,907 B1 * | 9/2004 | Choi .......................... 326/127 |

OTHER PUBLICATIONS

International Search Report issued Oct. 28, 2002 for Appln. No. PCT/US01/29028, 4 pages.

English-language Abstract of EP 0 436 823, printed from Dialog(R) File 348, 2 Pages (last visited Nov. 12, 2002).

English-language Abstract of JP 2000-196681, published Jul. 14, 2000, from http://www1.jpdl.jpo.go.jp, 2 Pages (last visited Nov. 12, 2002).

Copy of Written Opinion from PCT Application No. PCT/US01/29028, filed Sep. 18, 2001, 4 pages, (mailed Oct. 24, 2003).

* cited by examiner

LOW JITTER HIGH SPEED CMOS TO CML CLOCK CONVERTER

CROSS-REFERENCE TO RELATED APPLICATIONS

This application is a continuation of U.S. Non-Provisional application Ser. No. 09/953,279, filed Sep. 17, 2001 is now U.S. Pat. No. 6,794,907, which claims the benefit of U.S. Provisional Application No. 60/233,181, filed Sep. 15, 2000, all of which are incorporated herein by reference.

BACKGROUND OF THE INVENTION

1. Field of the Invention

The present invention relates to clock converters. More particularly, the present invention relates to a circuit configured to convert a clock signal having a complimentary metal oxide semiconductor (CMOS) duty cycle level to a clock signal having a current mode logic (CML) duty cycle level.

2. Background Art

High speed communication systems utilize a variety of different approaches to optimizing the performance of their associated system clocks. As clock rates increase to accommodate the demands of these high speed communications systems, the room for clock tolerances decreases. For example, small variations in a clock's output signal, known as jitter, may have a crippling effect on the operation and synchronization of interrelated clock dependent circuits. Furthermore, clock stability may be critical to the operation of logic circuits that are dependent upon the rising and falling edges of the clock's output signal. Thus, even a small amount of jitter in a clock's output signal may significantly alter the clock signal's duty cycle, consequently degrading the communication system's overall performance.

Particular integrated circuit technology types, such as CMOS and CML, are typically associated with specific duty cycle values. For example, CMOS systems normally produce signals having a duty cycle around 25% and CML systems normally produce signals having a duty cycle around 50%. The higher duty cycle characteristics of CML make it better suited for higher speed applications. Also, as known in the art, CMOS circuits operate at logical high voltage levels from about 0 to 2.5 volts, thus creating about a 2.5 volt peak-to-peak swing. On the other hand, CML level circuits operate around 1.5 volts to 2.5 volts, thus producing a 1 volt peak-to-peak swing. Some applications, however, may require attributes of both CMOS and CML technology. One approach to satisfying this requirement is the ability to convert CMOS signals into CML signals.

For example, a variety of conventional CMOS based frequency divider circuits receive a master clock signal as an input and produce a number of multi-phase signals as an output. These multi-phase divider circuits may be used to reduce the overall number of oscillators required on a given semiconductor chip, for example, thereby making available additional room on the chip to place more circuitry. Although beneficial in this capacity, these CMOS multi-phase divider circuits are inherently slow and their low duty cycle signals are susceptible to supply coupling, which causes jitter. As a result, there is a need for a device to convert a CMOS multi-phase output clock signal having a duty cycle of about 25% into a CML level clock signal having a duty cycle of at least 50%.

BRIEF SUMMARY OF THE INVENTION

Consistent with the principles of the present invention as embodied and broadly described herein, an exemplary circuit includes a first pair of transistors having gates thereof respectively forming first and second circuit inputs, sources thereof being connected together, and drains thereof being connected together and forming at least a first circuit output the exemplary embodiment also includes a second pair of transistors having gates thereof respectively forming third and fourth circuit inputs, sources thereof being connected together, and drains thereof being connected together and forming at least a second circuit output. Sources of the first pair of transistors are connected to the sources of the second pair of transistors.

Features and advantages of the present invention include the ability to convert a lower duty cycle clock signal in CMOS to a higher duty cycle clock signal in CML. Such a circuit may be ideal for use where both CMOS and CML technologies are used together, such as the low jitter and high speed environments of variable control oscillators used in phase locked loop (PLL) circuits. Additional features include the ability to insure excellent rejection of common mode voltages associated with circuit power supplies.

BRIEF DESCRIPTION OF THE DRAWINGS/FIGURES

The accompanying drawings, which are incorporated in and constitute a part of the specification, illustrate an embodiment of the invention and, together with the description, explain the purpose, advantages, and principles of the invention. In the drawings.

DETAILED DESCRIPTION OF THE INVENTION

The following detailed description of the present invention refers to the accompanying drawings that illustrate exemplary embodiments consistent with this invention. Other inventions are possible and modifications may be made to the embodiments without departing from the spirit and scope of the invention. Therefore, the following detailed description is not meant to limit the invention. Rather, the scope of the invention is defined by the appended claims.

It would be apparent to one of ordinary skill in the art that the present invention, as described below, may be implemented in many different embodiments. Thus the operation and behavior of the present invention will be described with the understanding that modifications are variations of the embodiments are possible, given the level of detail present herein.

Figure 1:
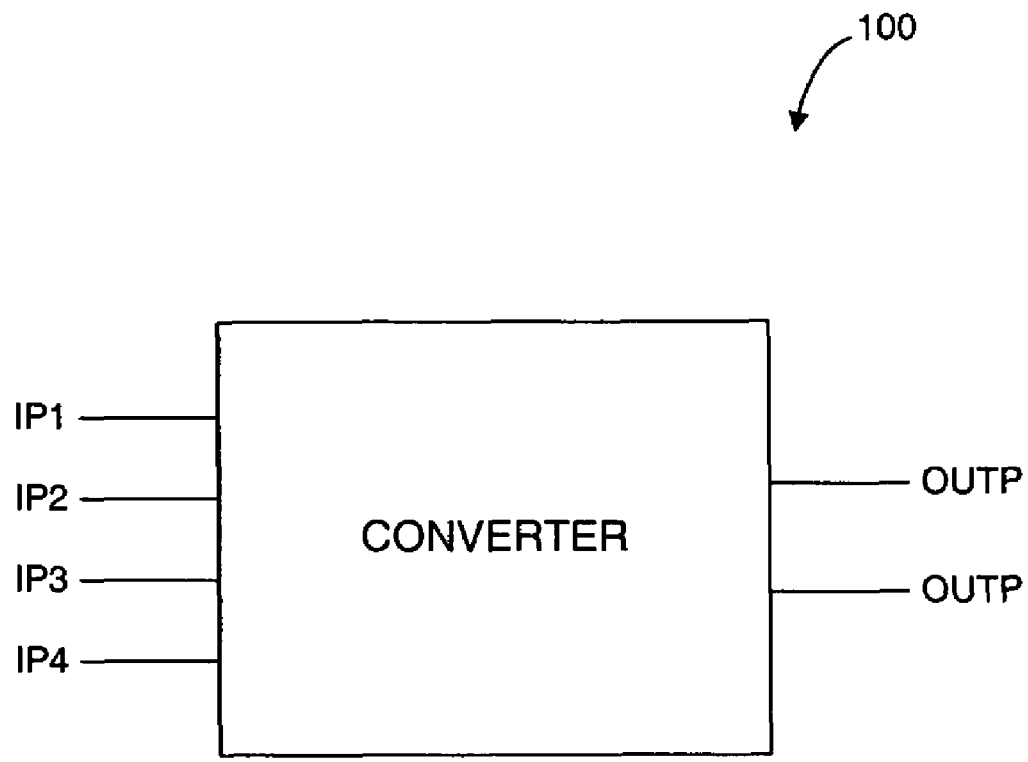
FIG. 1 is a block diagram of an exemplary converter constructed and arranged in accordance with the present invention.

FIG. 1 illustrates an exemplary embodiment of the present invention. In FIG. 1, an exemplary signal converter 100 is shown. The converter 100 includes input ports IP1, IP2, IP3, and IP4 which are configured to receive CMOS level multi-phase signals as inputs. The converter 100 also includes an inverting output port OUTN and a non-inverting output port OUTP, both configured to produce CML level signals as outputs. A more detailed view of embodiment of FIG. 1 is shown in FIG. 2.

Figure 2:
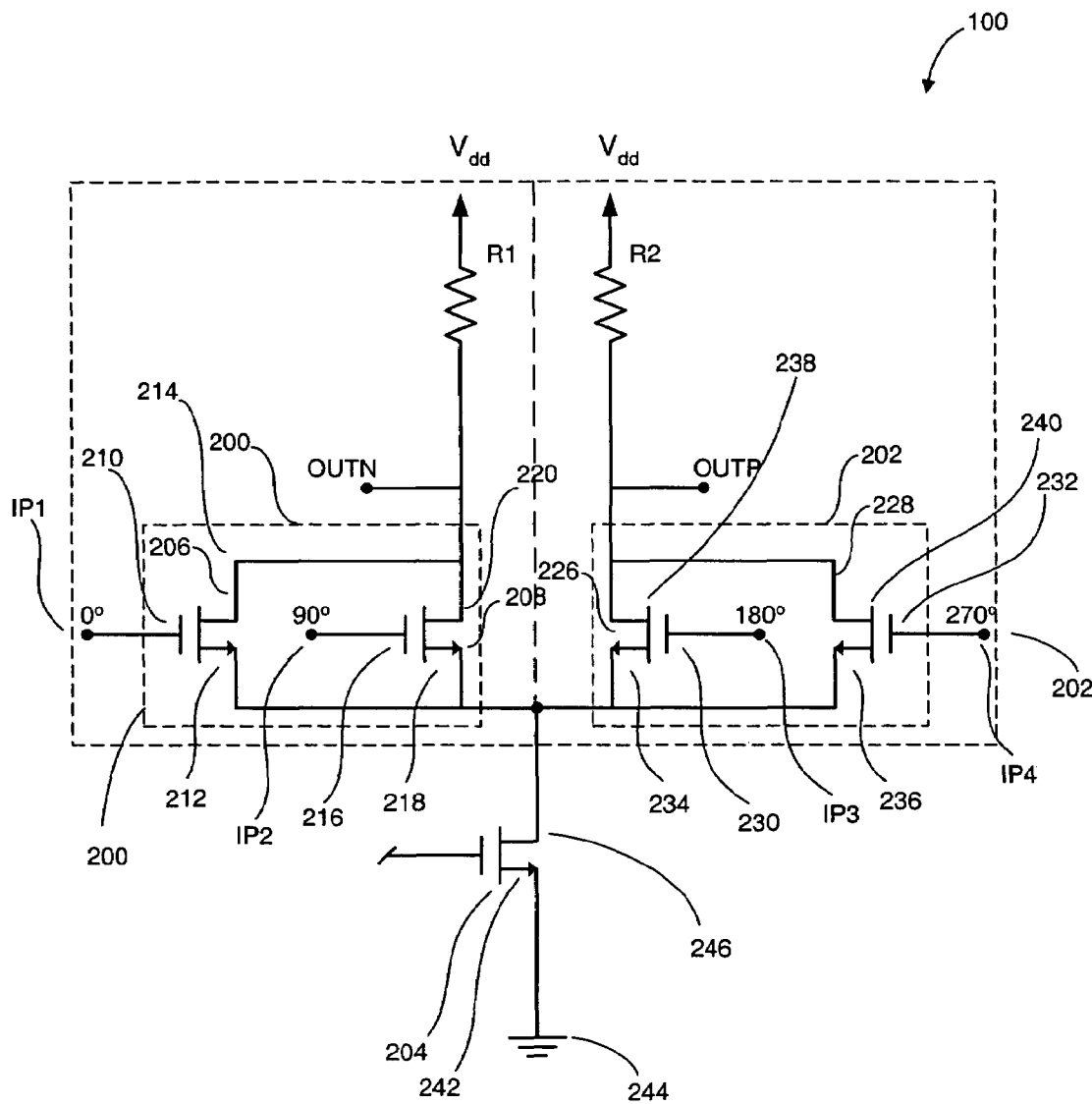
FIG. 2 is a schematic diagram of the exemplary embodiment of FIG. 1.

FIG. 2 is a schematic diagram of the exemplary signal converter 2 shown in FIG. 1. The converter 100 includes a first pair of transistors 200 electrically coupled to a second pair of transistors 202. The first and second transistor pairs 200 and 202 are known in the art as differential pair transistors. Also included in the converter 100 is a transistor 204 to supply constant current to the differential transistor pairs 200 and 202.

The first differential pair of transistors 200 includes NMOS field effect transistors (FETs) 206 and 208. The transistor 206 includes a gate 210, a source 212, and a drain 214. Similarly, the FET 208 includes a gate 216, a source 218, and a drain 220. The gates 210 and 216 are operatively configured as the input ports IP1 and IP2 respectively, as shown in FIG. 1 and discussed above. Also as shown, the sources 212 and 218 are connected together. The second differential pair of transistors includes FETs 226 and 228. The FETs 226 and 228 respectively include gates 230 and 232, sources 234 and 236, and drains 238 and 240. The drains 214 and 220 of respective transistors 206 and 208, are connected together. Further, the gates 238 and 240 are operatively configured as the input ports IP3 and IP4 respectively, shown in FIG. 1.

The inverting output port OUTN is formed of a connection node between the drains 214 and 220. A resistor R1, having one end connected to the inverting output port OUTN, is connected between the inverting output port OUTN and a source drain voltage supply source VDD. The non-inverting output port OUTP is formed of a connection node between the drains 238 and 240. Another resistor R2 is provided, having one end connected to the non-inverting output port OUTP and the other end connected to the source drain voltage supply VDD. Differential output CML signals are produced across the output ports OUTN and OUTP in response to multi-phase input CMOS signals. The type and impedance of resistors R1 and R2 are not critical to the present invention. However, these features may vary based upon various circuit design goals, such as a bandwidth, amplitude, and output swing of the associated output signals.

The transistor 204 provides constant current to the transistor pairs 200 and 202. The transistor 204 includes a source 242 connected to a ground node 244 and a drain 246 connected to the sources 212, 218, 234 and 236. As discussed above, the converter circuit 100 is configured to receive multi-phase CMOS level signals at a duty cycle of about 25% and convert the input CMOS level signals to CML level signals having a duty cycle of about 50%.

Figure 3:
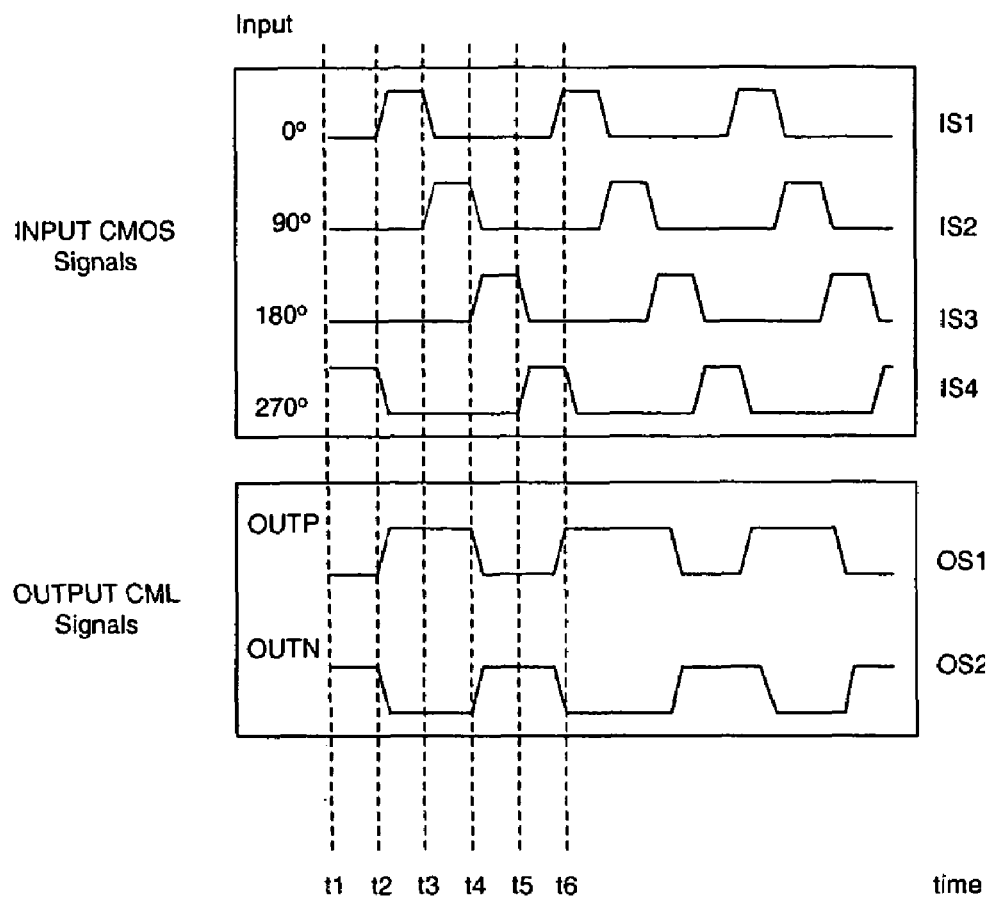
FIG. 3 is an illustration of input and output signals associated with the schematic diagram of FIG. 2.

FIG. 3 is a timing diagram of exemplary multi-phase CMOS level input signals and exemplary CML level output signals. In FIG. 3, CMOS level input signals IS1–IS4 are representative of four phases of an input clock signal. For purposes of illustration, IS1–IS4 are respectively shown to be at 0°, 90°, 180°, and 270° phase and are respectively received at input ports IP1, IP2, IP3 and IP4. The input CMOS signals are combined and converted to provide the CML level differential output signals OS1 and OS2. OS1 and OS2 are provided at the output ports OUTP and OUTN respectively. The timing diagram depicting t1–t5, shows the input timing of the signals IS1–IS4. Next, the operation of the converter 2 will be described.

The CMOS input signals IS1–IS4 may be generated by techniques known in the art, such as by use of a multi-phase divider circuit (not shown). As shown in FIGS. 2 and 3, at time (t1), the input signals IS1–IS4 are respectively provided to the input ports IP1, IP2, IP23 and IP4. Each of the signals IS1–IS4 is shown to be shifted in phase from all of the other signals by 90°. Next, at time (t2), input signal IS1 goes high and transistor 206 turns on. As a result, the output signal OS1, produced at output port OUTP, goes high and output signal OS2 produced at output port OUTN, goes low.

At time (t3), IS2 goes high and transistor 208 also turns on. Transistors 206 and 208 remain on until time (t4). At time (t4), output signal IS2 goes low and transistors 206 and 208 turn off. Additionally, at time (t4), the input signal IS3 goes high, transistor 226 turns on, the output signal OS1 goes low, and the output signal OS2 goes high. At time (t5), input signal IS4 goes high, transistor 228 turns on, OS1 remains low and OS2 remains high. Finally, at time (t6), input signal IS4 goes low, the transistor 228 turns off and OS1 and OS2 repeat the cycle that began at time (t2). Thus, FIG. 3 illustrates and actual conversion of the input CMOS level signals IS1–IS4 to output CML level signals OS1 and OS2 using the exemplary technique described above.

The output signals OS1 and OS2 are differential in nature. That is, a signal produced at the output port OUTP necessarily includes the presentation of an inverted version of the produced signal at the output port OUTN. The inverted signal is equal in amplitude but opposite in phase in relation to the signal produced at OUTP. Also, as shown in FIG. 3, the output CML level signals OS1 and OS2 have duty cycles of about 50%, whereas input signals IS1–IS4 operated at duty cycles of about 25%.

Low jitter is achieved because the converter 100 has excellent circuit symmetry. That is, the gate capacitance of transistors 206, 208, 226 and 228 are substantially equal. Thus, this circuit provides even loading from one stage of the converter to the other, that is, from one transistor to the other. Also, the differential circuit symmetry ensures excellent power supply and common mode voltage rejection.

The foregoing description of the preferred embodiments provide an illustration and description, but is not intended to be exhaustive or to limit the invention to the precise form disclosed. Modifications and variations are possible consistent with the above teachings or may be acquired from practice of the invention. Thus, it is noted that the scope of the invention is defined by the claims and their equivalents.

What is claimed is:

1. A circuit comprising:

a first pair of active devices having (i) control terminals thereof respectively forming first and second circuit input ports, the first and second circuit input ports being configured to receive first level external input signals having first and second phases respectively, (ii) sources common terminals thereof being connected together, and (iii) output terminals thereof being connected together and forming at least a first circuit output port configured to output a second level signal having a first phase; and a second pair of active devices having (i) control terminals thereof respectively forming third and fourth circuit input ports, the third and fourth input ports being configured to receive first level external input signals having third and fourth phases respectively, (ii) common terminals thereof being connected together, and (iii) output terminals thereof being connected together and forming at least a second circuit output port configured to output a second level signal having a second phase;

wherein the common terminals of the first pair of active devices are connected to the common terminals of the second pair of active devices.

2. The circuit of claim 1, wherein the active devices are transistors; and wherein the control terminals are gates, the common terminals are sources, and the output terminals are drains.

3. The circuit of claim 2 wherein the signals having the first level are complimentary metal-oxide semiconductor level signals and the signals having the second level are current mode logic level signals.

4. The circuit of claim 2, further comprising a first resistor having a first end coupled with the first circuit output port and a second resistor having a first end coupled with the second circuit output port.

5. The circuit of claim 4, further comprising a current supply having one end connected to the common terminals of the first and second pair of active devices.

6. The circuit of claim 5 wherein the current supply includes a fifth active device, an output terminal thereof forming the one end and a common terminal thereof being connected to ground.

7. The circuit of claim 2 wherein the first, second, third, and fourth phases respectively include substantially 0°, 90°, 180°, and 270°.

8. The circuit of claim 2 wherein the signals having the first, second, third, and fourth phase are received substantially simultaneously.

* * * * *